United States Patent
Zhang et al.

(10) Patent No.: US 9,741,837 B2
(45) Date of Patent: Aug. 22, 2017

(54) BIDIRECTIONAL INSULATED GATE BIPOLAR TRANSISTOR

(71) Applicants: UNIVERSITY OF ELECTRONIC SCIENCE AND TECHNOLOGY OF CHINA, Chengdu (CN); INSTITUTE OF ELECTRONIC AND INFORMATION ENGINEERING IN DONGGUAN, UESTC, Dongguan (CN)

(72) Inventors: Jinping Zhang, Chengdu (CN); Yadong Shan, Chengdu (CN); Gaochao Xu, Chengdu (CN); Xin Yao, Chengdu (CN); Jingxiu Liu, Chengdu (CN); Zehong Li, Chengdu (CN); Min Ren, Chengdu (CN); Bo Zhang, Chengdu (CN)

(73) Assignees: UNIVERSITY OF ELECTRONIC SCIENCE AND TECHNOLOGY OF CHINA, Chengdu (CN); INSTITUTE OF ELECTRONIC AND INFORMATION ENGINEERING IN DONGGUAN, UESTC, Dongguan (CN)

( * ) Notice: Subject to any disclaimer, the term of this patent is extended or adjusted under 35 U.S.C. 154(b) by 0 days.

(21) Appl. No.: 15/209,745

(22) Filed: Jul. 13, 2016

(65) Prior Publication Data

US 2016/0322483 A1    Nov. 3, 2016

Related U.S. Application Data

(63) Continuation-in-part of application No. PCT/CN2014/072757, filed on Feb. 28, 2014.

(51) Int. Cl.
*H01L 29/73*    (2006.01)
*H01L 29/739*   (2006.01)
(Continued)

(52) U.S. Cl.
CPC ...... *H01L 29/7397* (2013.01); *H01L 29/0634* (2013.01); *H01L 29/1095* (2013.01); *H01L 29/4236* (2013.01)

(58) Field of Classification Search
CPC ............ H01L 29/7397; H01L 29/0634; H01L 29/1095; H01L 29/4236
See application file for complete search history.

(56) References Cited

U.S. PATENT DOCUMENTS

| 2002/0060330 A1* | 5/2002 | Onishi ............... H01L 29/0634 257/262 |
| 2011/0210391 A1* | 9/2011 | Kitagawa .......... H01L 29/41766 257/331 |
| 2015/0214299 A1* | 7/2015 | Blanchard ........... H01L 29/7397 257/488 |

\* cited by examiner

*Primary Examiner* — Nathan W Ha
(74) *Attorney, Agent, or Firm* — Matthias Scholl P.C.; Matthias Scholl

(57) ABSTRACT

A bidirectional IGBT device, including a cellular structure including: two MOS structures, a substrate drift layer, two highly doped buried layers operating for carrier storage or field stop, two metal electrodes, and isolating dielectrics. Each MOS structure includes: a body region, a heavily doped source region, a body contact region, and a gate structure. Each gate structure includes: a gate dielectric and a gate conductive material. The two MOS structures are symmetrically disposed on the top surface and the back surface of the substrate drift layer. The heavily doped source region and the body contact region are disposed in the body region and independent from each other, and both surfaces of the heavily doped source region and the body contact region are connected to each of the two metal electrodes. The gate dielectric separates the gate conductive material from a channel region of each of the MOS structures.

4 Claims, 4 Drawing Sheets

(51) Int. Cl.
*H01L 29/06* (2006.01)
*H01L 29/10* (2006.01)
*H01L 29/423* (2006.01)

BIDIRECTIONAL INSULATED GATE BIPOLAR TRANSISTOR

CROSS-REFERENCE TO RELATED APPLICATIONS

This application is a continuation-in-part of International Patent Application No. PCT/CN2014/072757 with an international filing date of Feb. 28, 2014, designating the United States, now pending, the contents of which, including any intervening amendments thereto, are incorporated herein by reference. Inquiries from the public to applicants or assignees concerning this document or the related applications should be directed to: Matthias Scholl P.C., Attn.: Dr. Matthias Scholl Esq., 245 First Street, 18th Floor, Cambridge, Mass. 02142.

BACKGROUND OF THE INVENTION

Field of the Invention

The invention relates to a bidirectional insulated gate bipolar transistor (IGBT).

Description of the Related Art

As shown in FIG. 1, a conventional bidirectional IGBT adopts a nonpunchthrough structure formed by symmetrically disposing two MOS structures on a top surface and a back surface of a drift layer. However, the drift layer is relatively thick, which affects the performance of the device.

SUMMARY OF THE INVENTION

In view of the above-described problems, it is one objective of the invention to provide a bidirectional IGBT that possesses symmetric forward and reverse features, and thinner thickness of the drift layer and better distribution of the carrier concentration and distribution of the electric field under the same voltage endurance of the device.

To achieve the above objective, in accordance with one embodiment of the invention, there is provided a bidirectional insulated gate bipolar transistor. The transistor comprises cellular structures, an each cellular structure comprises: two MOS structures, a substrate drift layer, two highly doped buried layers operating for carrier storage or field stop, two metal electrodes, and isolating dielectrics. Each MOS structure comprising: a body region, a heavily doped source region, a body contact region, and a gate structure. Each gate structure comprising: a gate dielectric and a gate conductive material. The two MOS structures are symmetrically disposed on a top surface and a back surface of the substrate drift layer. The heavily doped source region and the body contact region are disposed in the body region and independent from each other, and both surfaces of the heavily doped source region and the body contact region are connected to each of the two metal electrodes. The gate dielectric separates the gate conductive material from a channel region of each of the MOS structures. The isolating dielectrics each are disposed between the gate conductive material and each metal electrode.

The substrate drift layer adopts a vertical full-super-junction structure or a vertical semi-super-junction structure. When the substrate drift layer adopts the vertical full-super-junction structure, a semiconductor substrate material of the drift layer is formed by alternately disposing vertical N-type doped pillars and vertical P-type doped pillars that satisfy a charge balance principle. When the substrate drift layer adopts the vertical semi-super-junction structure, the semiconductor substrate material of the drift layer directly forms a drift layer in a non-super-junction structure, drift layers in a super-junction structure are disposed on an upper surface and a lower surface of the drift layer in the non-super-junction structure, and each drift layer in the super-junction structure is formed by alternately disposing vertical N-type doped pillars and vertical P-type doped pillars that satisfy the charge balance principle, so that the drift layer in the non-super-junction structure and the drift layers in the super-junction structure form the vertical semi-super-junction structure.

Each of the highly doped buried layers is disposed between the substrate drift layer and each of the two MOS structures.

When the substrate drift layer adopts the vertical full-super-junction structure, the body region and the body contact region adopt semiconductor materials of a first conduction type; and the heavily doped source region and the highly doped buried layer adopt semiconductor materials of a second conduction type. When the substrate drift layer adopts the vertical semi-super-junction structure, the body region and the body contact region adopt semiconductor materials of a first conduction type; and the heavily doped source region, the highly doped buried layer, and the drift layer in the non-super-junction structure adopt semiconductor materials of a second conduction type.

In a class of this embodiment, the gate structure is a plane-gate structure or a trench-gate structure. When the gate structure adopts the trench-gate structure, the gate structure comprises: a gate dielectric disposed on trench walls and a gate conductive material disposed in a trench. The gate dielectric disposed on a side trench wall contacts the heavily doped source region and the body region of each MOS structure. The isolating dielectrics each are disposed between a surface of the gate conductive material disposed in the trench and each metal electrode. The gate dielectric disposed on a bottom trench wall separates the gate conductive material disposed in the trench from other parts of the transistor.

In a class of this embodiment, when the substrate drift layer adopts the vertical full-super-junction structure, the trench-gate structure extends downwards into the highly doped buried layer or even into the substrate drift layer in the vertical full-super-junction structure. When the trench-gate structure extends downwards into the highly doped buried layer, the gate dielectric disposed on the side trench wall further contacts the highly doped buried layer and the gate dielectric disposed on the bottom trench wall contacts the highly doped buried layer. When the trench-gate structure extends downwards into the substrate drift layer in the vertical full-super-junction structure, the gate dielectric disposed on the side trench wall further contacts the highly doped buried layer and the substrate drift layer in the vertical full-super-junction structure, and the gate dielectric disposed on the bottom trench wall contacts the substrate drift layer in the vertical full-super-junction structure.

In a class of this embodiment, when the substrate drift layer adopts the vertical semi-super-junction structure, the trench-gate structure extends downwards into the highly doped buried layer or even into the substrate drift layer in the vertical semi-super-junction structure. When the trench-gate structure extends downwards into the highly doped buried layer, the gate dielectric disposed on the side trench wall further contacts the highly doped buried layer, and the gate dielectric disposed on the bottom trench wall contacts the highly doped buried layer. When the trench-gate structure extends downwards into the substrate drift layer in the vertical semi-super-junction structure, the gate dielectric disposed on the side trench wall further contacts the highly doped buried layer and the substrate drift layer in the vertical semi-super-junction structure, and the gate dielectric disposed on the bottom trench wall contacts the substrate drift layer in the vertical semi-super-junction structure.

In the bidirectional IGBT comprising the two symmetrically disposed MOS structures, when the device operates in a forward direction, the highly doped buried layer disposed between a first MOS structure and the substrate drift layer serves as a carrier storing layer for improving a carrier concentration of the drift layer of the device, and the highly doped buried layer disposed between a second MOS structure and the substrate drift layer serves as an electric field stop layer. When the device operates in a reverse direction, the highly doped buried layer disposed between the second MOS structure and ion, and a gate structure; and each gate structure comprising: a gate dielectric and a gate conductive material;
a subst of the device, and the highly doped buried layer 18 disposed between the first MOS structure and the substrate drift layer serves as the electric field stop layer. Thus, the bidirectional IGBT of the invention possesses the symmetric forward and inverse features. Furthermore, the drift layer adopts the super-junction structure which is completely consumed before the breakdown of a PN-junction formed by the body region and the highly doped buried layer, so that the negative influence of the highly doped buried layer on the voltage endurance of the IGBT device is reduced, and the function of the super-junction structure is utilized to improve the voltage endurance of the unit thickness of the drift layer.

Advantages of the bidirectional IGBT according to embodiments of the invention are summarized as follows:

In summary, the bidirectional IGBT provided in the invention possesses the symmetric forward and reverse features, and thinner thickness of the drift layer and better distribution of the carrier concentration and distribution of the electric field under the same voltage endurance of the device, so that the device has much better forward conduction characteristic and positive balance between the forward conduction characteristic and the switching loss characteristics.

BRIEF DESCRIPTION OF THE DRAWINGS

The invention is described hereinbelow with reference to the accompanying drawings, in which.

DETAILED DESCRIPTION OF THE EMBODIMENTS

For further illustrating the invention, experiments detailing a bidirectional IGBT are described below. It should be noted that the following examples are intended to describe and not to limit the invention.

Figure 1:
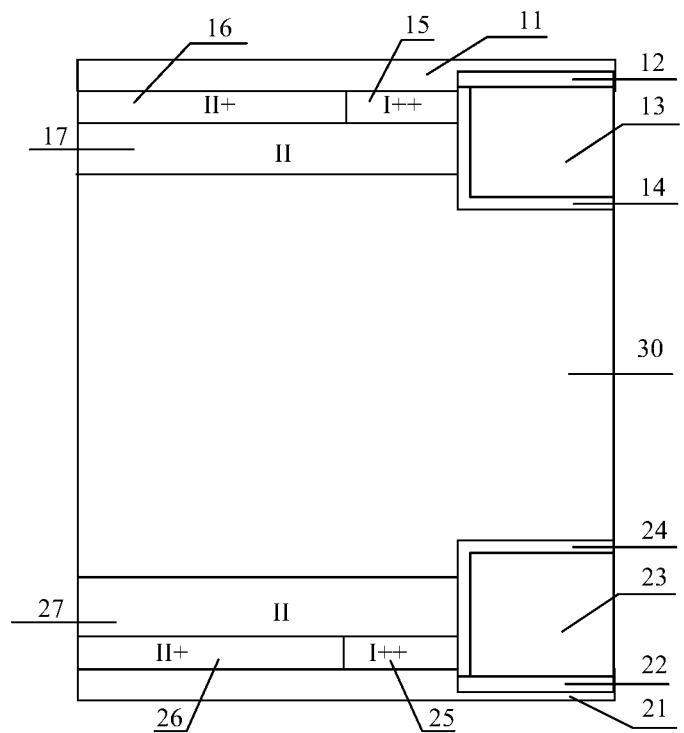
FIG. 1 is a structure diagram of a conventional bidirectional IGBT device.
Figure 2:
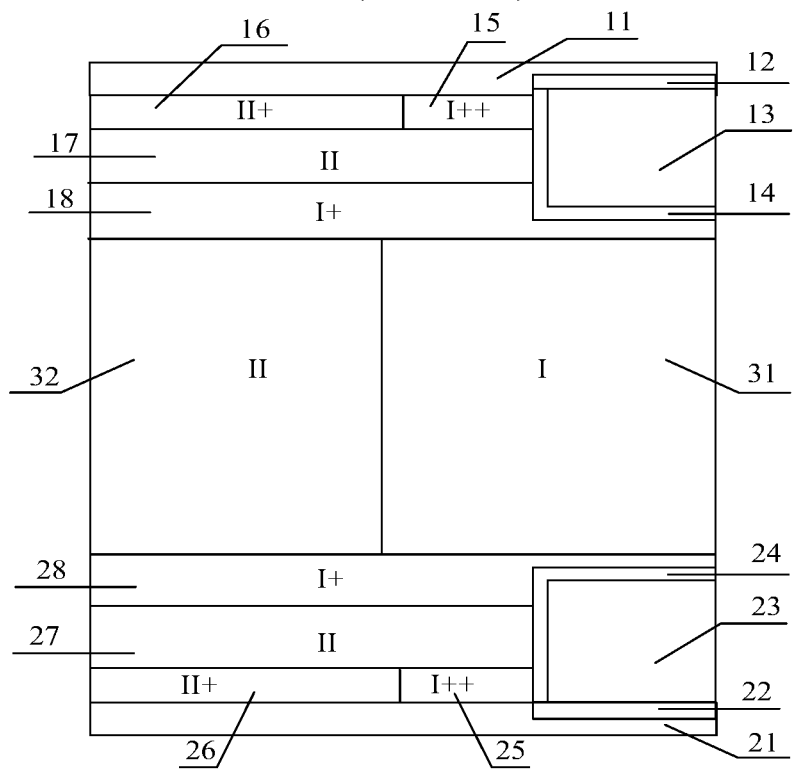
FIG. 2 is a structure diagram of a first bidirectional IGBT in accordance with one embodiment of the invention.

A first bidirectional IGBT is shown in FIG. 2. A cellular structure of the first bidirectional IGBT comprises two MOS structures symmetrically disposed on a top surface and a back surface of a substrate drift layer. Each MOS structure comprises: a body region 17 or 27, a heavily doped source region 15 or 25 disposed in the body region 17 or 27, and a body contact region 16 or 26 disposed in the body region 17 or 27. The heavily doped source region 15 or 25 and the body contact region 16 or 26 are independent from each other, and both surfaces of the heavily doped source region 15 or 25 and the body contact region 16 or 26 are connected to each of two metal electrodes 11 or 21. Each MOS structure further comprises a gate structure. Each gate structure is a trench-gate structure comprising a gate dielectric 14 or 24 disposed on trench walls and a gate conductive material 13 or 23 disposed in a trench. The gate dielectric 14 or 24 disposed on a side trench wall contacts the heavily doped source region 15 or 25 and the body region 17 or 27 of each MOS structure. Isolating dielectrics 12 or 22 is disposed between a surface of the gate conductive material 13 or 23 disposed in the trench and each metal electrode 11 or 21. The gate dielectric 14 or 24 disposed on a bottom trench wall separates the gate conductive material 13 or 23 disposed in the trench from other parts of the transistor.

The substrate drift layer adopts a vertical full-super-junction structure, that is, a semiconductor substrate material of the drift layer is formed by alternately disposing vertical N-type doped pillars 31 and vertical P-type doped pillars 32 that satisfy the charge balance principle.

A highly doped buried layer 18 or 28 operating for carrier storage or field stop is disposed between the substrate drift layer and each of the two MOS structures.

The body region 17 or 27 and the body contact region 16 or 26 adopt semiconductor materials of a first conduction type. The heavily doped source region 15 or 25 and the highly doped buried layer 18 or 28 operating for carrier storage or field stop adopt semiconductor materials of a second conduction type.

In forward operation of the first bidirectional IGBT device, the channel of the second MOS structure is cutoff by controlling a second gate conductive material 23 (gate electrode), so that the function of the second MOS structure is similar to a collector of the conventional unidirectional IGBT device, while the function of the first MOS structure is similar to an emitter of the conventional unidirectional IGBT device. By controlling a first gate conductive material 13 (gate electrode), the on and off states of the forward IGBT is realized. When the device operates in the forward direction, the highly doped buried layer 18 disposed between the first MOS structure and the substrate drift layer serves as a carrier storing layer for improving a carrier concentration of the drift layer of the device, and the highly doped buried layer 28 disposed between the second MOS structure and the substrate drift layer serves as an electric field stop layer. Thus, the forward IGBT operates in the IGBT structure mode possessing the carrier storing layer and the electric field stop layer. In the meanwhile, the super-junction structure of the drift layer is utilized, and the super-junction structure is completely consumed before the breakdown of a PN-junction formed by the body region 17 and the highly doped buried layer 18 in the first MOS structure, so that the negative influence of the highly doped buried layer 18 on the voltage endurance of the IGBT device is reduced, and the function of the super-junction structure is utilized to improve the voltage endurance of the unit thickness of the drift layer. When the reverse IGBT operates, the working principle is the same as that of the forward IGBT, the channel of the first MOS structure is cutoff by controlling a first gate conductive material 13 (gate electrode), so that the function of the first MOS structure is similar to the collector of the conventional unidirectional IGBT device, while the function of the second MOS structure is similar to the emitter of the conventional unidirectional IGBT device. By controlling the second gate conductive material 23 (gate electrode), the on and off states of the reverse IGBT is realized. When the device operates in a reverse direction, the highly doped buried layer 28 disposed between the second MOS structure and the substrate drift layer serves as the carrier storing layer for improving the carrier concentration of the drift layer of the device, and the highly doped buried layer 18 disposed between the first MOS structure and the substrate drift layer serves as the electric field stop layer. Thus, the reverse IGBT operates in the IGBT structure mode possessing the carrier storing layer and the electric field stop layer. In the meanwhile, the super-junction structure of the drift layer is utilized, and the super-junction structure is completely consumed before the breakdown of a PN-junction formed by the body region 27 and the highly doped buried layer 28 in the second MOS structure, so that the negative influence of the highly doped buried layer 28 on the voltage endurance of the IGBT device is decreased, and the function of the super-junction structure is utilized to improve the voltage endurance of the unit thickness of the drift layer.

Thus, based on the symmetrically arranged carrier storing layer and the field stop layer, together with the super-junction structure, the bidirectional IGBT provided in the invention possesses the symmetric forward and reverse features, and thinner thickness of the drift layer and better distribution of the carrier concentration and distribution of the electric field under the same voltage endurance of the device, so that the device has much better forward conduction characteristic and positive balance between the forward conduction characteristic and the switching loss characteristics.

Figure 3:
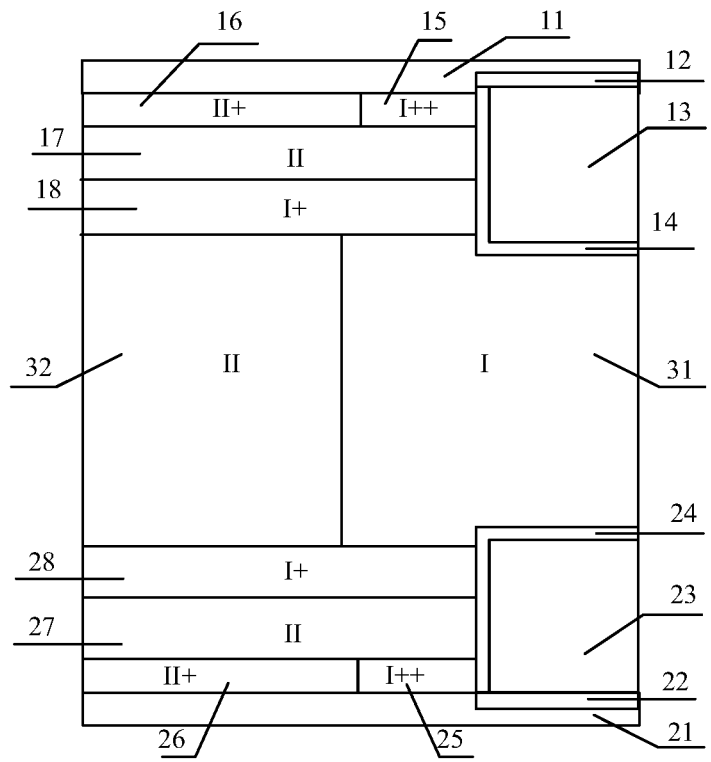
FIG. 3 is a structure diagram of a second bidirectional IGBT in accordance with one embodiment of the invention.

Structure of a second bidirectional IGBT device, as illustrated in FIG. 3, is basically the same as that of the first bidirectional IGBT except that the trench-gate structure extends downwards into the substrate drift layer in the vertical full-super-junction structure, that is the gate dielectric 14 or 24 disposed on the side trench wall further contacts the highly doped buried layer 18 or 28 and the substrate drift layer in the vertical full-super-junction structure, and the gate dielectric 14 or 24 disposed on the bottom trench wall contacts the substrate drift layer in the vertical full-super-junction structure. Working principle of the bidirectional IGBT illustrated in FIG. 3 is the same as that illustrated in FIG. 2, while the bidirectional IGBT in FIG. 3 adopts a trench-gate structure with a deeper trench structure, so that the working performance of thereof is further improved, however, the manufacture process is much difficult.

Figure 4:
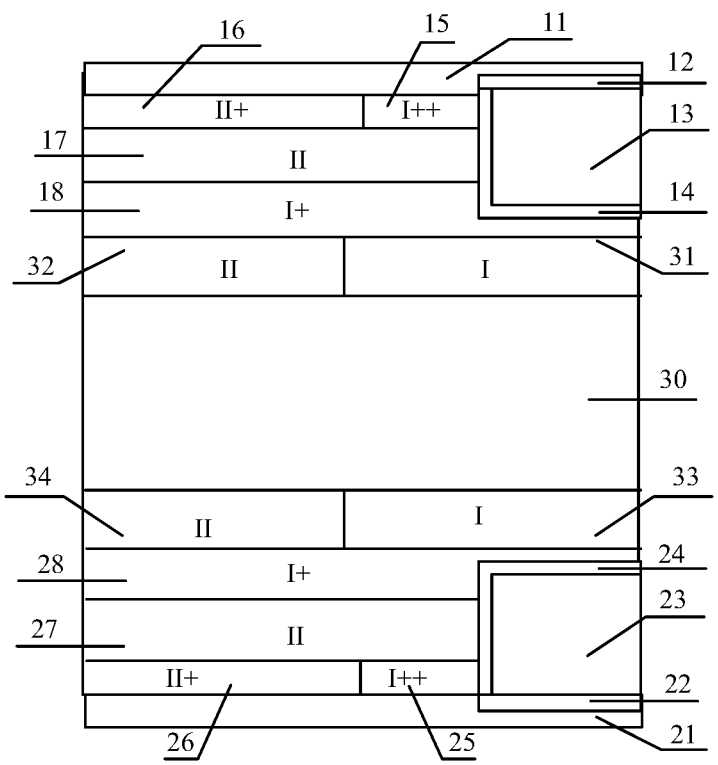
FIG. 4 is a structure diagram of a third bidirectional IGBT in accordance with one embodiment of the invention.

Structure of a third bidirectional IGBT is illustrated in FIG. 4. The cellular structure of the third bidirectional IGBT comprises: two MOS structures symmetrically disposed on a top surface and a back surface of a substrate drift layer. Each MOS structure comprises: a body region 17 or 27, a heavily doped source region 15 or 25 disposed in the body region 17 or 27, and a body contact region 16 or 26 disposed in the body region 17 or 27. The heavily doped source region 15 or 25 and the body contact region 16 or 26 are independent from each other, and both surfaces of the heavily doped source region 15 or 25 and the body contact region 16 or 26 are connected to a metal electrode 11 or 21. The MOS structure further comprises a gate structure comprising a gate dielectric 14 or 24 and a gate conductive material 13 or 23. The gate dielectric 14 or 24 separates the gate conductive material 13 or 23 from a channel region of the MOS structure. Isolating dielectrics 12 or 22 is disposed between the gate conductive material 13 or 23 and the metal electrode 11 or 21.

The substrate drift layer adopts a vertical semi-super-junction structure, that is, a semiconductor substrate material of the drift layer directly forms a drift layer in a non-super-junction structure 30, drift layers in a super-junction structure are disposed on an upper surface and a lower surface of the drift layer in the non-super-junction structure 30, and each drift layer in the super-junction structure is formed by alternately disposing vertical N-type doped pillars 31 and vertical P-type doped pillars 32 that satisfy the charge balance principle. Thus, the drift layer in the non-super-junction structure 30 and the drift layers in the super-junction structure form the vertical semi-super-junction structure.

A highly doped buried layer 18 or 28 operating for carrier storage or field stop is disposed between the substrate drift layer and each of the two MOS structures.

The body region 17 or 27 and the body contact region 16 or 26 adopt semiconductor materials of a first conduction type. The heavily doped source region 15 or 25, the highly doped buried layer 18 or 28 operating for carrier storage or field stop, and the drift layer in the non-super-junction structure 30 adopt semiconductor materials of a second conduction type.

FIGS. 2-4 only illustrate several specific modes for carrying out the invention based on the concept of the invention, and persons skilled in the art should understand that the gate structure in the bidirectional IGBT can adopt the trench-gate structure or a plane-gate structure. The semiconductor materials utilized in the whole device adopt Si, SiC, GaAs, or GaN. Besides, by controlling the MOS structures on the top surface and the back surface of the substrate drift layer, the function of the bidirectional IGBT as well the function of the bidirectional MOSFET can be realized.

Figure 5:
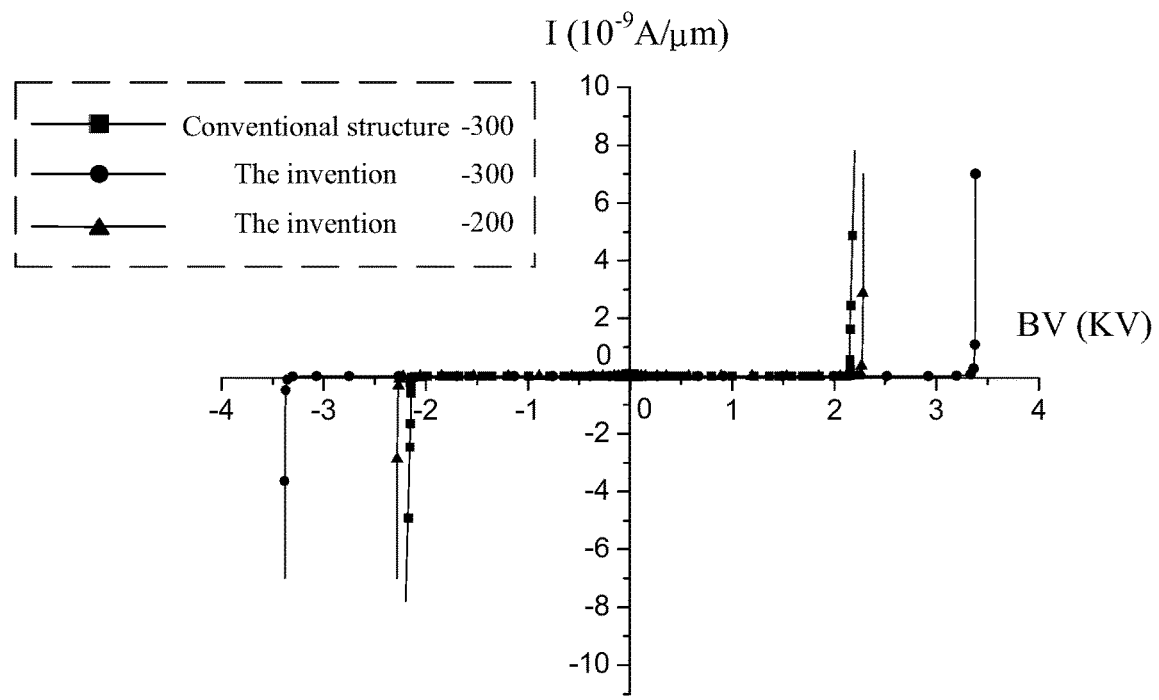
FIG. 5 is a comparison chart of the bidirectional blocking I-V characteristics among the conventional bidirectional IGBT having a thickness of 300 µm and bidirectional IGBTs of the invention having thickness of 200 µm and 300 µm.

FIG. 5 is a comparison chart of the bidirectional blocking I-V characteristics between the conventional IGBT and IGBT of the invention, in which, the line formed by solid dots indicates the voltage endurance of the IGBT structure of the invention at a thickness of 200 μm, the line formed by solid regular triangles indicates the voltage endurance of the IGBT structure of the invention at the thickness of 300 μm, and the line formed by hollow rectangular indicates the voltage endurance of the conventional IGBT structure at the thickness of 300 μm. It is known from the comparison chart that the conventional bidirectional IGBT structure has the voltage endurance of 2195 V at the thickness of 300 μm, while the IGBT structure of the invention has the voltage endurance of 3386 V at the thickness of 300 μm and the voltage endurance of 2277 V at the thickness of 200 μm. Thus, under the same voltage endurance, the thickness of the IGBT structure of the invention can be greatly reduced.

Figure 6:
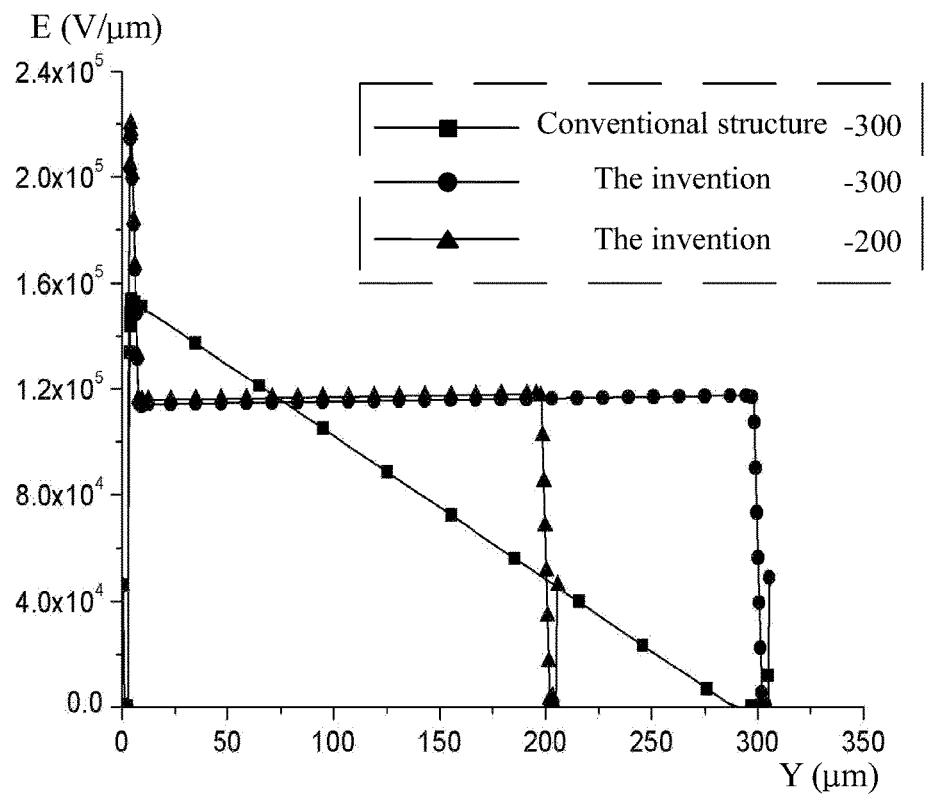
FIG. 6 is a comparison chart of vertical electric field distribution at breakdown of a device among the conventional bidirectional IGBT having a thickness of 300 µm and bidirectional IGBTs of the invention having thickness of 200 µm and 300 µm.

FIG. 6 is a comparison chart of vertical electric field distribution at the breakdown of the device between the conventional IGBT and the IGBT of the invention, in which, the line formed by solid dots indicates the electric field distribution of the IGBT structure of the invention at a thickness of 200 μm, the line formed by solid regular triangles indicates the electric field distribution of the IGBT structure of the invention at the thickness of 300 μm, and the line formed by hollow rectangular indicates the electric field distribution of the conventional IGBT structure at the thickness of 300 μm. It is known from the comparison chart that the electric field distribution in the drift layer of the conventional bidirectional IGBT is in the triangular shape and in a nonpunchthrough structure, while the electric field distribution of the bidirectional IGBT provided in the invention is approximately in the uniform distribution, and the electric field is stopped in the highly doped buried layer 18 or 28 possessing the field stop function between the substrate drift layer and the MOS structures. Thus, the IGBT structure provided by the invention is able to greatly improve the voltage endurance of the unit thickness of the drift layer.

Figure 7:
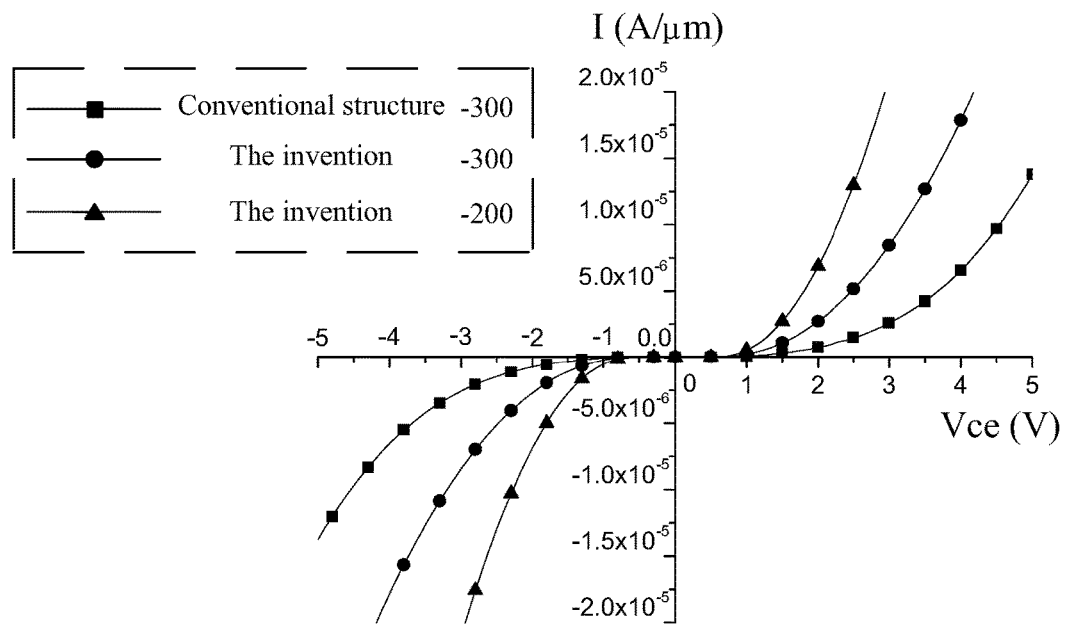
FIG. 7 is a comparison chart of bidirectional conducting I-V characteristics among the conventional bidirectional IGBT having a thickness of 300 µm and bidirectional IGBTs of the invention having thickness of 200 µm and 300 µm.

FIG. 7 is a comparison chart of bidirectional conducting I-V characteristics between the conventional IGBT and the IGBT of the invention, in which, the line formed by solid dots indicates the I-V characteristics of the IGBT structure of the invention at a thickness of 200 μm, the line formed by solid regular triangles indicates the I-V characteristics of the IGBT structure of the invention at the thickness of 300 μm, and the line formed by hollow rectangular indicates the I-V characteristics of the conventional IGBT structure at the thickness of 300 μm. It is known from the comparison chart the forward conduction voltage drop of the IGBT structure of the invention is much smaller than that of the conventional bidirectional IGBT structure.

Figure 8:
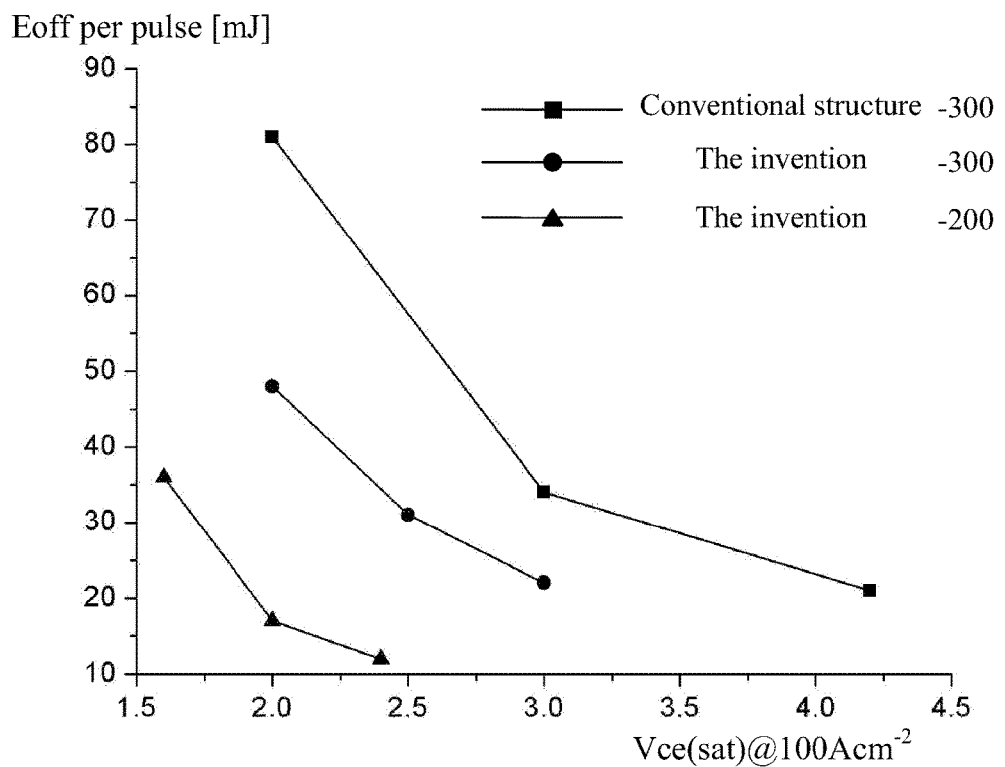
FIG. 8 is a comparison chart of a compromise between a switching loss and a conduction voltage drop among the conventional bidirectional IGBT having a thickness of 300 µm and bidirectional IGBTs of the invention having thickness of 200 µm and 300 µm.

FIG. 8 is a comparison chart of a compromise between a switching loss and a conduction voltage drop between the conventional IGBT structure and the IGBT structure of the invention, in which, the line formed by solid dots indicates the compromise between the switching loss and the forward conduction voltage drop of the IGBT structure of the invention at a thickness of 200 μm, the line formed by solid regular triangles indicates the compromise between the switching loss and the forward conduction voltage drop of the IGBT structure of the invention at the thickness of 300 μm, and the line formed by hollow rectangular indicates the compromise between the switching loss and the forward of the conventional IGBT structure at the thickness of 300 μm. It is known from the comparison chart that the compromise relation of the IGBT structure provided in the invention is obviously superior to that of the conventional.

Thus, in the bidirectional IGBT structure provided in the invention, the two highly doped buried layers 18 or 28 have different functions. When the forward IGBT operates, the first the highly doped buried layer 18 disposed between the first MOS structure and the substrate drift layer serves as the carrier storing layer, and the highly doped buried layer 28 disposed between the second MOS structure and the substrate drift layer serves as the electric field stop layer. When the reverse IGBT operates, the functions of the two highly doped buried layers 18 or 28 are exchanged. Based on the symmetry of the parameters of the two highly doped buried layers 18 or 28, the bidirectional IGBT structure is ensured to possess the symmetric forward and reverse features. When the highly doped buried layer serves as the carrier storing layer, a minority of carrier barrier is provided for the device in the vicinity of the emitter via the relatively high doping concentration, thus, the carrier concentration in the drift layer in the vicinity of the carrier storing layer of the device is significantly improved, the distribution of the carrier concentration in the drift layer is significantly optimized, and the forward conduction voltage drop and the compromise between the forward conduction characteristic and the switching loss characteristic are reduced. When the highly doped buried layer serves as the electric field stop layer, the electric field that punches through the carrier storing layer at the opposite side and the drift layer is stopped at the electric field stop layer so as to enable the device to operate in a field stopping structure and to improve the voltage endurance of the drift layer in the unit thickness. Thus, whenever the forward or the reverse IGBT operates, the device is in the IGBT structure mode that possesses both the carrier storing layer and the electric field stop layer. In the meanwhile, the drift layer adopts the vertical full-super-junction structure or the symmetric semi-super-junction structure. By parameter design, the super-junction structure or the symmetric semi-super-junction structure is completely consumed before the breakdown of a PN-junction formed by the body region of the MOS structure and the highly doped buried layer 18 or 28, so that the negative influence of the highly doped buried layer 18 or 28 on the voltage endurance of the IGBT device is decreased, and the function of the super-junction structure is utilized to improve the voltage endurance of the unit thickness of the drift layer. Thus, the bidirectional IGBT provided in the invention possesses the symmetric forward and reverse features, and thinner thickness of the drift layer and better distribution of the carrier concentration and distribution of the electric field under the same voltage endurance of the device, so that the device has much better forward conduction characteristic and positive balance between the forward conduction characteristic and the switching loss characteristics.

While particular embodiments of the invention have been shown and described, it will be obvious to those skilled in the art that changes and modifications may be made without departing from the invention in its broader aspects, and therefore, the aim in the appended claims is to cover all such changes and modifications as fall within the true spirit and scope of the invention.

The invention claimed is:

1. A bidirectional insulated gate bipolar transistor, the transistor comprising a cellular structure comprising:
   a) two MOS structures, each MOS structure comprising: a body region, a heavily doped source region, a body contact region, and a trench gate structure; and the trench gate structure comprising a gate dielectric, a gate conductive material, and a trench having a wall;
   b) a substrate drift layer;
   c) two highly doped buried layers, the two highly doped buried layers adapted for carrier storage or field stop;
   d) two metal electrodes; and
   e) isolating dielectrics;
   wherein:
   the two MOS structures are symmetrically disposed on a top surface and a back surface of the substrate drift layer;
   the heavily doped source region and the body contact region are disposed in the body region and independent from each other, and both surfaces of the heavily doped source region and the body contact region are connected to one of the two metal electrodes;

the gate dielectric is disposed on the wall and the gate conductive material is disposed in the trench;

the gate dielectric contacts the heavily doped source region and the body region;

the gate dielectric separates the gate conductive material from a channel region of each of the two MOS structures;

the isolating dielectrics each is disposed between a surface of the gate conductive material and one of the two metal electrodes;

the substrate drift layer adopts a vertical full-super-junction structure, in which, a semiconductor substrate of the substrate drift layer is formed by alternately disposing vertical N-type doped pillars and vertical P-type doped pillars;

the vertical N-type doped pillars and the vertical P-type doped pillars satisfy a charge balance principle;

each of the two highly doped buried layers is disposed between the substrate drift layer and one of the two MOS structures;

the trench gate structure extends downwards into one of the two highly doped buried layers, whereby the gate dielectric further contacts the one of the two highly doped buried layers and the gate dielectric separates the gate conductive material from the one of the two highly doped buried layers; and the body region and the body contact region adopt semiconductor materials of a first conduction type; and the heavily doped source region and the highly doped buried layer adopt semiconductor materials of a second conduction type.

2. The transistor of claim 1, wherein:

the trench gate structure further extends downwards into the substrate drift layer, whereby the gate dielectric further contacts the substrate drift layer and the gate dielectric separates the gate conductive material from the substrate drift layer.

3. A bidirectional insulated gate bipolar transistor, the transistor comprising a cellular structure comprising:
a) two MOS structures, each MOS structure comprising: a body region, a heavily doped source region, a body contact region, and a trench gate structure; and the trench gate structure comprising a gate dielectric, a gate conductive material, and a trench having a wall;
b) a substrate drift layer;
c) two highly doped buried layers, the two highly doped buried layers adapted for carrier storage or field stop;
d) two metal electrodes; and
e) isolating dielectrics;
wherein:

the two MOS structures are symmetrically disposed on a top surface and a back surface of the substrate drift layer;

the heavily doped source region and the body contact region are disposed in the body region and independent from each other, and both surfaces of the heavily doped source region and the body contact region are connected to one of the two metal electrodes;

the gate dielectric is disposed on the wall and the gate conductive material is disposed in the trench;

the gate dielectric contacts the heavily doped source region and the body region;

the gate dielectric separates the gate conductive material from a channel region of each of the two MOS structures;

the isolating dielectrics each is disposed between a surface of the gate conductive material and one of the two metal electrodes;

the substrate drift layer adopts a vertical semi-super-junction structure comprising a drift layer in a non-super-junction structure and two drift layers each in a super-junction structure, in which, a semiconductor substrate of the substrate drift layer directly forms the drift layer in a non-super-junction structure, the two drift layers each in a super-junction structure are respectively disposed on an upper surface and a lower surface of the drift layer in a non-super-junction structure, and each of the two drift layers in a super-junction structure is formed by alternately disposing vertical N-type doped pillars and vertical P-type doped pillars;

the vertical N-type doped pillars and the vertical P-type doped pillars satisfy a charge balance principle;

each of the two highly doped buried layers is disposed between the substrate drift layer and one of the two MOS structures;

the trench gate structure extends downwards into one of the two highly doped buried layers, whereby the gate dielectric further contacts the one of the two highly doped buried layers and the gate dielectric separates the gate conductive material from the one of the two highly doped buried layers; and the body region and the body contact region adopt semiconductor materials of a first conduction type; and the heavily doped source region, the highly doped buried layer, and the drift layer in a non-super-junction structure adopt semiconductor materials of a second conduction type.

4. The transistor of claim 3, wherein:

the trench gate structure further extends downwards into the substrate drift layer, whereby the gate dielectric further contacts the substrate drift layer and the gate dielectric separates the gate conductive material from the substrate drift layer.

* * * * *